United States Patent [19]
Roesner et al.

[11] 4,101,349
[45] Jul. 18, 1978

[54] INTEGRATED INJECTION LOGIC STRUCTURE FABRICATED BY OUTDIFFUSION AND EPITAXIAL DEPOSITION

[75] Inventors: Bruce B. Roesner, Tustin; Denis J. McGreivy, Laguna Beach, both of Calif.

[73] Assignee: Hughes Aircraft Company, Culver City, Calif.

[21] Appl. No.: 736,976

[22] Filed: Oct. 29, 1976

[51] Int. Cl.² .................. H01L 21/22; H01L 27/04
[52] U.S. Cl. ................................. 148/175; 29/577 C; 29/580; 148/187; 148/188; 357/15; 357/44; 357/46; 357/56; 357/49; 357/90; 357/92
[58] Field of Search ............. 148/175, 187, 189; 29/580, 577; 357/15, 44, 46, 56, 49, 90, 92

[56] References Cited
U.S. PATENT DOCUMENTS

| 3,768,150 | 10/1973 | Sloan et al. | 29/580 X |
| 3,823,353 | 7/1974 | Berger et al. | 357/46 X |
| 3,909,807 | 9/1975 | Fulton | 357/46 X |
| 3,922,565 | 11/1975 | Berger et al. | 357/46 X |

OTHER PUBLICATIONS

Berger et al., "Base Ring Transistor and Method of Production" I.B.M. Tech. Discl. Bull., vol. 14, No. 1, Jun. 1971, p. 302.
Cook et al., "I²L II" Int. Elect. Dev. Tech. Dig., 1975, pp. 284-287.
"Injection Logic's Range ....." Electronics, vol. 48, No. 14, Jul. 10, 1975, pp. 86-89.
Berger et al., "Schottky Transistor Logic" ISSCC Digest of Tech. Papers, 1975, pp. 172-173.

Primary Examiner—R. Dean
Assistant Examiner—W. G. Saba
Attorney, Agent, or Firm—W. H. MacAllister; Joseph E. Szabo

[57] ABSTRACT

Merged transistor logic integrated circuit wherein the vertical transistor is formed by auto-doping an epitaxial silicon layer for an improved transistor doping profile. Further device improvements are achieved by the incorporation of Schottky diodes into the circuit.

3 Claims, 21 Drawing Figures

INTEGRATED INJECTION LOGIC STRUCTURE FABRICATED BY OUTDIFFUSION AND EPITAXIAL DEPOSITION

BACKGROUND OF THE INVENTION

Integrated injection logic (I²L), also called merged transistor logic (MTL), is fast becoming a major digital circuit technology due to its high packing density and very low power dissipation. However, until now I²L circuits have achieved only medium speed operation (gate delays greater than 10 nanoseconds).

It is the principal object of the present invention to improve the basic I²L structure to permit it to challenge high speed technologies such as the Schottky TTL while retaining its advantage of very low power operation.

In accordance with one feature of the present invention the doping profile of the vertical I²L transistor is optimized by auto-doping into an epitaxial layer on a semiconductor substrate to form the base of the vertical transistor in that layer, with the doping concentration of the base being greater than that of the collector but smaller than that of the emitter of the transistor.

In accordance with another feature of the invention, the speed of the device is further enhanced by the formation of one or more Schottky diodes as integral parts of the I²L structure.

Further features of the invention will become apparent from the following detailed description with reference to the attached drawings, in which.

Since its invention, the I²L device has been the subject of many informative articles which should be consulted for a basic understanding of the technology to which the present invention pertains. Exemplary of technical articles describing this new technology are those appearing in an *Electronics* magazine, Vol. 47, No. 5, pages 92–96; Vol. 47, No. 20, pages 111–118; Vol. 48, No. 3, pages 83–88; Vol. 48, No. 14, pages 86–89; Vol. 48, No. 18, pages 89–95; Vol. 48, No. 20, pages 99–103.

Figure 1:
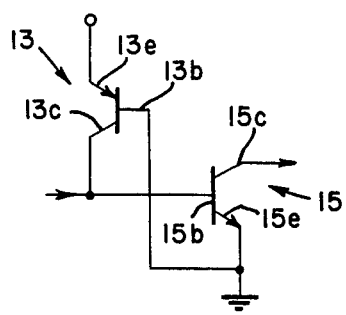
FIG. 1 is a schematic of an I²L logic gate of the type to which the present invention is directed.

The basic I²L logic gate 11 is configured electrically as illustrated in FIG. 1. It is comprised of a PNP transistor 13 acting as a current source to an NPN transistor 15 which acts as an inverter.

The collector 13c of the PNP transistor 13 is tied to the base 15b of the NPN transistor 15 whose emitter 15e is tied to the base 13b of the PNP transistor 13. A logic "1" state at the input of the circuit, the inverter transistor base 15b, causes a logic "0" to occur at the output of the circuit, the inverter transistor collector 15c. The maximum voltage drop across the I L gate, on the order of 0.7–0.8 volts, occurs across the forward biased emitter-base junction of the PNP transistor 13.

Figure 2:
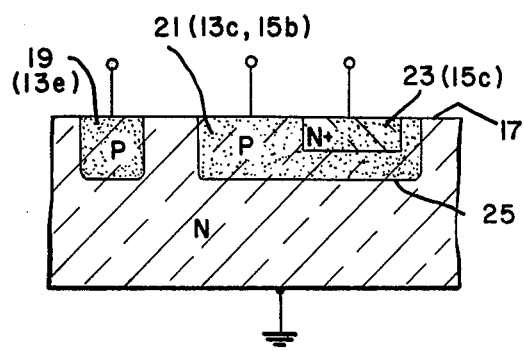
FIG. 2 is a cross section through the logic gate illustrated schematically in FIG. 1.

As shown in FIG. 2 the conventional I²L gate structure 11 is fabricated by diffusing, or ion implanting, a P-type dopant through the surface 18 of an N-type silicon wafer 17 to form first and second adjacent P-type regions 19 and 21 in the silicon wafer, and then diffusing a smaller heavily doped N+ region 23 into one of the adjacent P regions, shown here as the region 21. In the structure illustrated in FIG. 2 the P regions 19 and 21 form respectively the emitter and collector 13e, 13c of the PNP transistor 13, the N substrate acts as both the PNP transistor base region 13b and the NPN transistor emitter region 15e, and the N+ region 23 serves as the NPN transistor collector 15c from which the output of the I²L logic circuit is taken. To aid in appreciating the correspondence of various semiconductor regions in FIG. 2 with the circuit elements in FIG. 1, the circuit element reference numerals are parenthetically noted next to the reference numerals which identify the semiconductor regions in FIG. 2.

Two factors contribute to the very high packing density which is characteristic of I²L circuits: (1) The physical merging of the PNP transistor 13 and the vertical NPN transistor 15, and (2) the absence of a surface contact opening to the N substrate 17 serving as the PNP transistor base 13b and the NPN transistor emitter 15e. Indeed the entire logic gate circuit illustrated in FIGS. 1 and 2 occupies about the same space as that which would normally be occupied by a PNP transistor alone. This is so because the I²L circuit consists essentially of the PNP transistor alone. This is so because the I²L circuit consists essentially of the PNP transistor 13, usually characterized as a "lateral" transistor, augmented by a small N+ region formed in the collector region 13c of the lateral transistor 15 in conjunction with the underlying portion of the wafer, hereinafter referred to, by its functional name, as the substrate 17, which second transistor is usually characterized as a "vertical" transistor in contrast to the laterally configured transistor 13.

In order for I²L logic circuit to be operative, the common emitter current gain β of the NPN transistor 15 must be greater than unity. Although this criterion is easily satisfied, the structure illustrated in FIG. 2 will not yield a high speed I²L logic gate. Since the function of the NPN transistor 15 is to switch the logic state which appears at the input of the I²L gate 11, it is necessary, for high speed operation, that this transistor exhibit a short switching time. An inspection of the NPN transistor doping profile illustrated in FIG. 3a reveals several factors which inhibit high speed operation. First, the emitter (substrate) injection coefficient γ will be low because the doping concentration of the N-type substrate 17 is lower than that of the diffused P base 21. Expressed mathematically, $$\gamma = \frac{I_n}{I_n + I_p} \sim 1 + \frac{W_B D_p N_{AB} - 1}{L_n D_n N_{DE}} <<1$$

Where: n
$D_n$ — electron diffusion coefficient in the base (cm²/sec)
$D_p$ — hole diffusion coefficient in the emitter (cm²/sec)
$I_n$ — emitter electron current (amps)
$I_p$ — emitter hole current (amps)
$L_n$ — diffusion length for holes in emitter (cm)
$N_{AB}$ — acceptor impurity density of the base region (cm$^{-3}$)
$N_{DE}$ — donor impurity density of the emitter region (cm$^{-3}$)
$W_B$ — base thickness (cm)
γ — emitter efficiency In addition to the disadvantage of the base region 21 having a higher doping concentration than that of the emitter region formed by the substrate 17, a further drawback results from the collector region 23 having a higher doping concentration than that of the base region 21. Particularly, the collector-base junction 25 of the NPN transistor 15 has a large capacitance and low breakdown voltage because the N+ collector region 23 is more heavily doped than the P region 21 which serves as the base of the transistor.

Figure 3A:
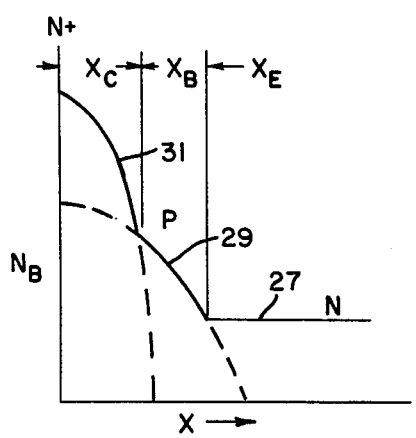
FIG. 3a illustrates the doping profile of a conventionally fabricated I²L structure.

The progressively increasing doping concentration of the substrate 17, the P-doped region 21 and the N+ doped region 23 shown in the FIG. 3a is inherent in the doping process which has been described as that which is used to produce the device illustrated in FIG. 2. In FIG. 3a doping concentration $N_B$ is plotted against the depth of the device illustrated in FIG. 2 and designated by the symbol X. Initially, the N substrate 17 has a doping concentration shown by the curve 27 in FIG. 3a. In order to form the P region 21 in the N substrate 17 that region must be doped so as to counteract or overcome the effect of the N-type dopants in the substrate 17. Thus, the P-type region 21 may be defined as beginning at that plane in the substrate 17 where the P dopant concentration exceeds the concentration of N-type dopants. The dopant concentration of the P region 21 which forms the base of the NPN transistor 15 is shown by the curve 29 in FIG. 3a and it is seen that, since dopant enters the P region 21 from above, the doping concentration of the P region 21 increases progressively from the P-N interface 25 toward the substrate surface 18, again as shown by the curve 29. By the same reasoning the N+ region 23 which forms the collector of the NPN transistor 15 may be defined as beginning at that plane where the concentration of N-type dopants exceeds that of the P-type dopants in the region 21 and, as shown by the curve 31 in FIG. 3a, the doping concentration of the N+ region 23 increases from that plane to a maximum at the substrate surface 18.

Figure 3B:
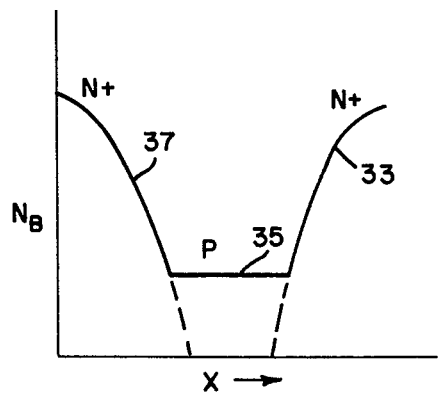
FIG. 3b illustrates the doping profile of a partially improved structure obtained by the use of a P-type epitaxial layer, but not taking full advantage of the present invention.

It has been reported by Cook, McNally, and San, Int. Elect. Dev. Tec. Dig., 284-287 (1975) and by Berger and Wiedmann, ISSCC Digest of Technical Papers, 172-173 (1975) that the speed-powder characteristic of I²L gates may be improved by growing a P-type epitaxial layer on an N+ conductivity type substrate. The resulting NPN transistor doping profile is illustrated in FIG. 3b. Since the NPN transistor device is formed by the deposition of an epitaxial layer on the substrate rather than by counter-doping a portion of the substrate, the doping concentration of the NPN base region represented by the curve 35 can be lower than that of the substrate represented by the curve 33. However, since the collector region of the NPN transistor is still formed by counter-doping a portion of the epitaxial layer, its doping concentration, as represented by the curve 37, is higher than that of the NPN transistor base region. A serious disadvantage of the structure is that the NPN base width varies with the thickness of the epitaxial layer. Such thickness variations are typically on the order of ± 0.1 micron and become important when sub-micron base widths are involved.

Figure 3C:
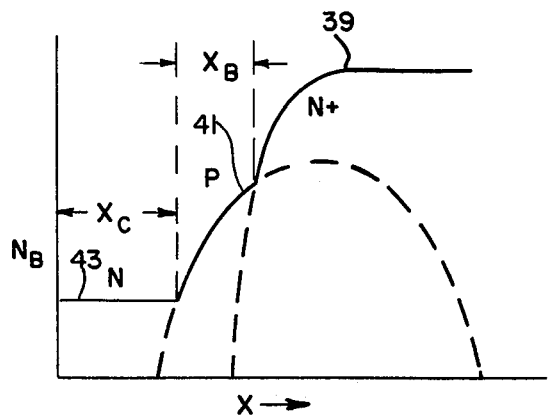
FIG. 3c illustrates the desirable doping profile in an I²L structure achieved through the use of the present invention.

In accordance with the present invention, and citing particular conductivity types for sake of specificity only, the "vertical" transistor is formed by growing an N-type epitaxial layer on an N+ substrate, the surface of which receives a P-type dopant prior to the formation of the epitaxial layer. During the epitaxial growth and subsequent heat treatment, the P dopant "up-diffuses" into the epitaxial layer, resulting in the ideal doping profile illustrated in FIG. 3c. Since the epitaxial layer is of the same conductivity as the substrate, the epitaxial layer need not be counter-doped in order to form a collector region therein. As a result the doping concentrations of the emitter, base, and collector of the vertical transistor, as represented respectively by the curves 39, 41 and 43, can be made to be of progressively diminishing magnitude. That is, the dopant concentration of the transistor base will be lower than that of the transistor emitter region, but higher than that of the transistor collector region. A further advantage of the present invention is that the transistor base width is now independent of the epitaxial layer thickness, so that variations in the thickness of that layer affect only the collector series resistance. The reason why this is so will become apparent from the detailed description of a preferred method for fabricating an I²L device in accordance with the present invention which follows.

The first step of the inventive process consists of driving into first and second spaced apart regions 45 and 47 in the surface 49 of a first conductivity type semiconductor body 51 a second conductivity type dopant. Usually the conductivity type of the semiconductor body 51 will be N+ and the dopant will be P type. As a specific example, the semiconductor body 51 may consist of an antimony wafer having an N+ dopant concentration of $3 \times 10^{18}$ per cm$^3$ and its oxide layer may be formed to a thickness of 2800A° by exposing the wafer to an atmosphere of $H_2 + O_2$ for 10 minutes at 1100° C. It has been found desirable to increase the N+ dopant concentration of the substrate to at least $2 \times 10^{19}$ cm$^{-3}$ by subjecting it to an antimony diffusion at 1230° C for twenty minutes prior to formation of the oxide layer 53.

Figure 5A:
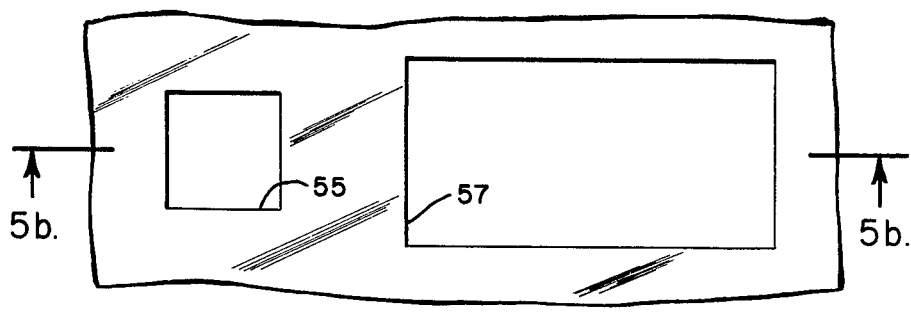
FIGS. 5a and 5b are plan and cross-sectional views illustrating the first in a series of steps preferred for producing an I²L logic gate in accordance with the present invention, FIGS. 5a and 5b illustrating the device just after a P-type dopant has been diffused into the surface of the N-type substrate.
Figure 5B:
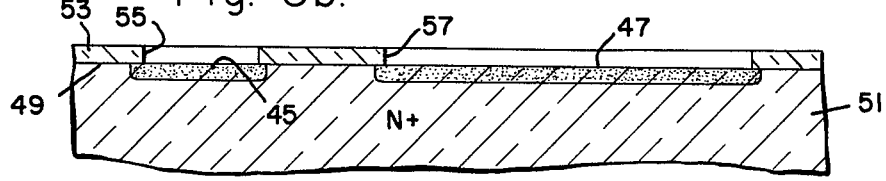

As illustrated in FIGS. 5a and 5b the first step may be accomplished by oxidizing a semiconductor wafer to form an oxide layer 53 thereon, after which, by well-known techniques, a pair of openings 55 and 57 are etched in the oxide layer.

P dopant may then be applied to regions 45 and 47 either by conventional diffusion 52 by ion implantation to achieve a concentration of approximately $1 \times 10^{17}$ cm$^{-3}$.

Figure 6:
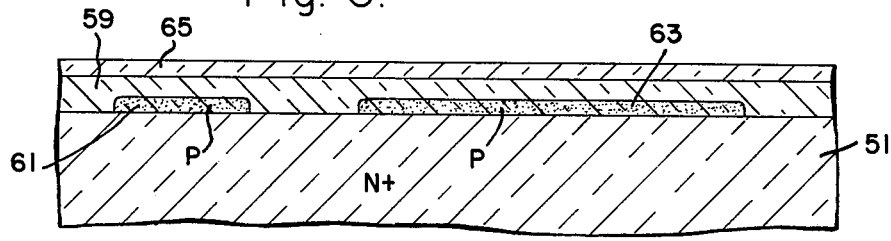
FIG. 6 is a cross-sectional view of the device illustrated in FIGS. 5a and 5b after an epitaxial layer has been formed on the substrate surface.

The next major process step is to grow an epitaxial layer of the same conductivity type as the substrate 51 on its surface 49 and to diffuse dopant from the regions 45 and 47 up into the epitaxial layer to form therein corresponding first and second spaced apart, buried regions which are of the same conductivity type as the dopant driven into the regions 45 and 47 in the preceding step. Toward this end the oxide layer 53 grown during the preceding step is now stripped from the surface 49 and an epitaxial layer is grown thereon (FIG. 6). A suitable method for doing so is to expose the surface 49 to a silane (SiH4) atmosphere at 1000° C so as to grow a layer 1.4 microns thick with a resistivity of 0.3 ohm-centimeters and an N dopant concentration of $2 \times 10^{16}$/cm$^3$. It is during the growing of the epitaxial layer that the P dopant driven into the regions 45 and 47 during the preceding step is "up-diffused" into the epitaxial layer 59 to form the first and second spaced apart buried regions 61 and 63 which will eventually serve as the emitter and collector of the lateral transistor portion of the I²L circuit as well as the base of the vertical transistor portion of the I²L circuit. This process of updiffusion is more commonly referred to in the art as "autodoping" and will be so referred to herein.

It is an important feature of the invention that the doping concentration of the buried region 63 can be made less than that of the substrate 51 but greater than that of the overlying portion 74 of the epitaxial layer 59. This can be achieved by proper control of the steps during which the doped regions 45 and 47 are formed and during which the epitaxial layer 59 is grown. In the example illustrated the buried regions 61 and 63 attain a doping concentration of $1 \times 10^{17}$/cm$^3$.

Figure 7A:
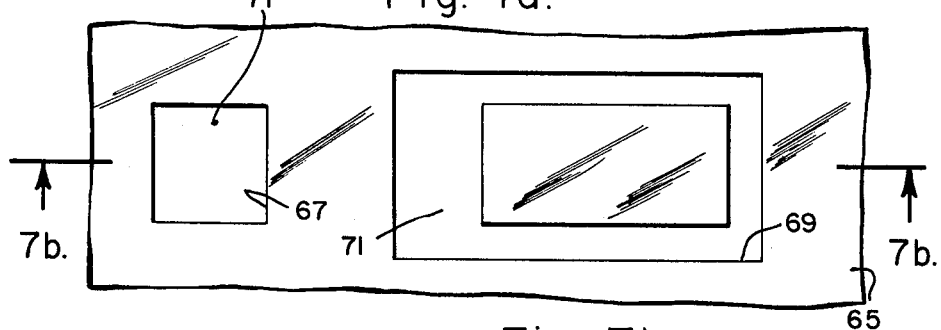
FIGS. 7a and 7b are plan and cross-sectional views of the device illustrated in the preceding figures just after a mask has been formed for the subsequent diffusion of P-type dopant to make contact with the previously up-diffused P-type dopant formed in the steps illustrated in FIG. 6.
Figure 7B:
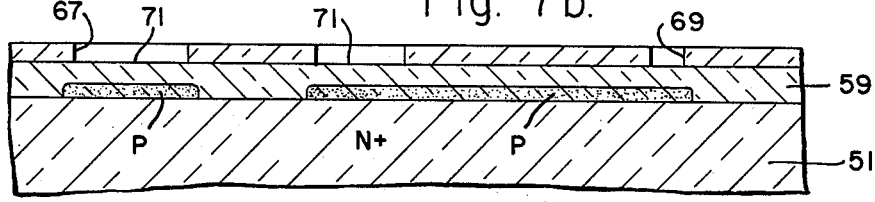
Figure 8:
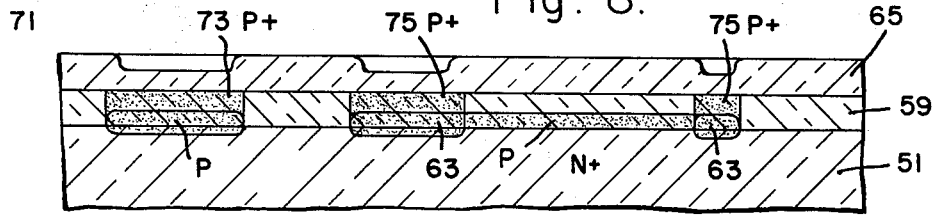
FIG. 8 illustrates the device just after the P-type material has been diffused through the mask illustrated in FIGS. 7a and 7b.

The third major step of the inventive process is to establish contact with the buried regions 61 and 63 which step may also serve to form one or more collector regions above the doped buried region 63. In preparation for this step a new oxide layer 65 is grown (FIG. 6). An oxide thickness of 1800A°, produced by a 30 minute exposure of the epitaxial layer 59 to an atmosphere of $O_2 + H_2$ at 1000° C has been found suitable, although temperatures below 1000° C can and have also been used. By means of known techniques, two openings 67 and 69 are etched in the oxide layer 65 (FIGS. 7a, 7b) followed by driving of a second conductivity type dopant into the surface 71 of the epitaxial layer to form first and second conductive regions 73 and 75 extending from the surface 71 of the epitaxial layer to the first and second buried regions 61 and 63 (FIG. 8). In accordance with the invention, the opening 69 which is etched above the buried region 63 is annular, in order to give conductive region 75 above the buried region 63 that configuration. In keeping with this aspect of the invention the annular conductive region 75 together with the buried region 63 forms a bucket-shaped region in the epitaxial layer 59. The region 74 of the epitaxial layer which lies within this bucket-shaped region is isolated from the remainder of the epitaxial layer 59 and will serve as the collector of the vertical transistor portion of the I²L circuit.

In the specific example being given, the conductive regions 73 and 75 are formed by a P diffusion achieved by exposing the epitaxial layer surface 71 to boron at 1050° C for 10 minutes and by driving the boron into the epitaxial layer for 30 minutes 1000° C in an atmosphere of $H_2 + O_2$. The resulting boron deposition has been found to result in a concentration of $1 \times 10^{20}$ per cm$^3$ and a junction depth $X_j$ of approximately 1.5 microns. The thickness of the oxide layer 65 after the preceding step will be approximately 2000A° over the diffusions 73 and 75, and approximately 2700A° over the remaining portions of the epitaxial layer 59.

Figure 9A:
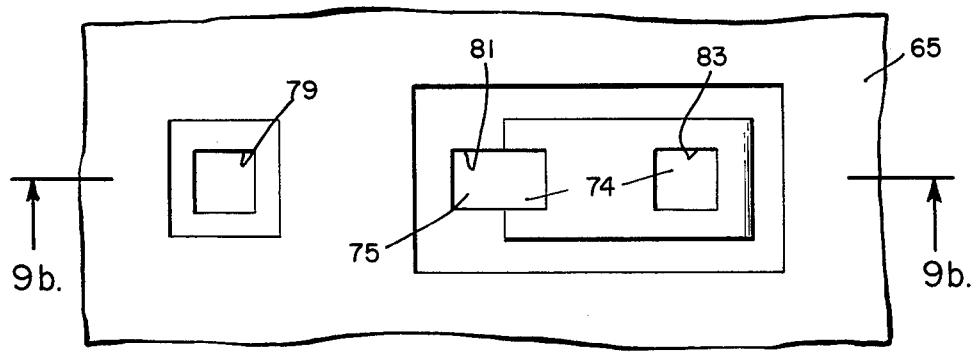
FIGS. 9a and 9b are plan and cross-sectional views respectively of a device illustrated in the preceding drawings following steps during which a thick oxide layer has been formed over the epitaxial layer and contact openings have been formed through that thick oxide layer.
Figure 9B:
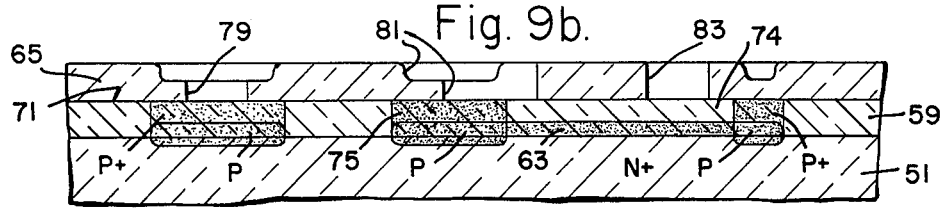

In order to improve device performance, the oxide formed during the preceding step is etched off the back of the substrate 51 (not shown) after which a phosphorous deposition is performed at 925° C for 10 minutes to act as a getter. Finally, a mask is again formed over the oxide layer 65 and holes 79, 81 and 83 are etched in it (FIGS. 9a, 9b) preparatory to the deposition of electrical contacts on the epitaxial layer surface 71 over the first and second conductive regions 73 and 75 as well as over that portion of the epitaxial layer which is within annular region 75.

Figure 4:
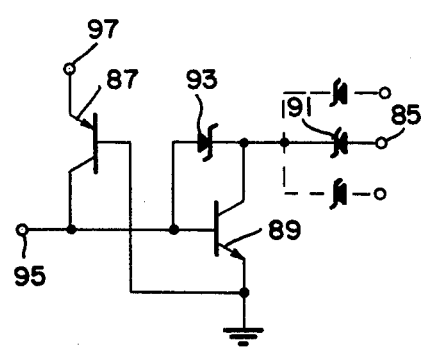
FIG. 4 is a schematic diagram of an I²L logic gate including Schottky diodes for enhanced speed of operation in accordance with one of the features of the present invention.

The I²L circuit whose fabrication is being illustrated with reference to FIGS. 5 through 11 is schematically illustrated in FIG. 4. With the completion of the step just described, the lateral PNP transistor 87 and the vertical NPN transistor 89 have been formed. What has been fabricated by the process illustrated in FIGS. 5-9 is an integrated circuit comprising a first conductivity type semiconductor body 51 having on its surface 49 an epitaxial layer 59 of the same conductivity type. Buried in the epitaxial layer 59 are first and second spaced apart regions 61 and 63 which lie along the interface of the epitaxial layer 59 and the substrate 51. Extending from the first of the buried region 61 to the epitaxial layer's surface 71 is a first conductive region 73 and a second conductive region 75 extends from the buried region 63 to the epitaxial layer's surface 71.

As indicated previously, the second conductive region 75 is annular and, together with the second buried region 63, forms a bucket-shaped region in the epitaxial layer 59 forming therein an isolated portion 74. In the case of the particular device illustrated in the FIGS. 9a and 9b, the substrate 51 and the epitaxial layer 59 have an N conductivity type, whereas the buried regions 61 and 63 and the conductive regions 73 and 75 are of P-type conductivity. It can now be seen that the first and second buried regions 61 and 63 constitute respectively the emitter and collector regions of the lateral transistor 87 illustrated in FIG. 4, and that, since the conductive regions 73 and 75 are of the same conductivity type as the buried regions 61 and 63 they also form part of the emitter and collector regions of the transistor 87.

Forming the collector region of the vertical transistor 89 is the isolated portion 74 of the epitaxial layer, with the base region of that transistor being constituted by the second buried region 63 and, to some extent, by the second conductive region 75, since again it is a doped extension of the buried region 63 and is of the same conductivity type as that region. The base region of the lateral transistor 87 is formed by the epitaxial layer 59 and, in particular, that portion of the layer which is between the regions 61, 73 and 63, 75. Finally, the emitter region of the vertical transistor 89 is constituted by the semiconductor body 51.

As indicated by the doping concentrations recited during the description of the process steps performed thus far, the doping concentrations of the isolated portion 74, the buried region 63 and the substrate 51, which respectively form the collector, base, and emitter of the vertical transistor 89 are progressively greater in that order, with the specific concentrations recited having been $1.5 \times 10^{16}/cm^3$ $1 \times 10^{17}/cm^3$ and $3 \times 10^{18}/cm^3 - 2 \times 10^{19}/cm^3$ for the isolated portion 74, buried region 63, and substrate 51, respectively.

Figure 10:
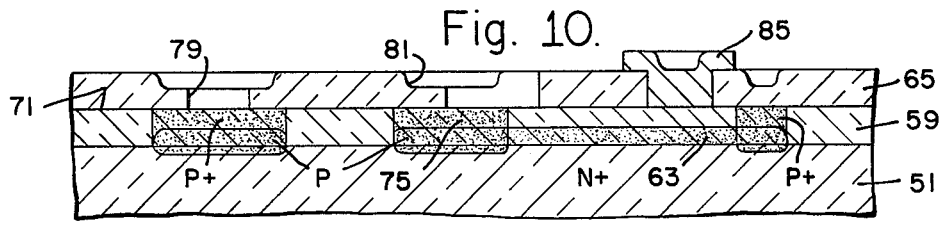
FIG. 10 illustrates the device after a contact has been formed through the thick oxide layer to a portion of the epitaxial layer forming the collector of the vertical transistor portion of the illustrated device.

The remaining steps of the process, illustrated in FIGS. 10 and 11, and to be described next, are directed at forming contacts to the I²L circuit formed by the preceding steps. In keeping with an optional feature of the invention the contacts which are formed also serve as Schottky diodes, two of which, 91 and 93 are illustrated in FIG. 4. The advantages of providing I²L circuits with Schottky diodes have been recognized as seen, for example, in the above-cited article in *Electronics*, Vol. 48, No. 20, at pages 101–103. Specifically, the provision of a plurality of Schottky diodes such as 91 on the collector output of the I²L circuit provides isolation between different collectors which are thus effectively provided. While only a single such diode is shown fabricated in FIGS. 10 and 11, it will be understood that usually more than one such diode will be fabricated and two additional such diodes are indicated by dashed lines in FIG. 4.

The second Schottky diode 93 may be used to advantage as a clamp between the base and collector of the vertical transistor 89. The provision of the Schottky diode 93 reduces power consumption by limiting voltage swings and also increases the operating speed of the gate by reducing charge storage. A caution which has to be observed in forming the metal contacts for the Schottky diodes 91 and 93 is that usually they will have to have different forward voltages. Consequently, it will be necessary to use different metals in forming the diodes 91 and 93 such that the barrier height of the de-coupling diode 91 is less than that of the clamping diode 93.

Continuing with the description of the steps of forming the I²L device, and in particular the Schottky diodes 91 and 93, a metal layer is deposited and selectively etched to form contact 85 extending through the oxide opening 83 into contact with the isolated region 74 forming the collector of the vertical transistor 89. Thereafter a second metal layer is deposited and selectively etched to form a contact extending through the oxide opening 81 to interface with both the conductive region 75 and the isolated epitaxial layer region 74. In addition to serving as a terminal through which electrical contact may be made to the conductive region 75 and therethrough to the buried region 63, the contact 95 through its interface with the epitaxial layer 59 also serves to form a Schottky diode 93 shunted across those regions in the epitaxial layer which form the base and collector of the vertical transistor 89.

As observed before, the barrier heights of the Schottky diodes 91 and 93 must be different and it is for this reason that the contacts 85 and 95 should be formed of two different metals. Suitable metals to give the desired relationship of barrier heights are titanium for the first deposited metal layer, of which the contact 85 is formed, and a silicon-aluminum alloy for the second layer of which the contact 95 is formed. Preferably both layers should be annealed for ten minutes in $N_2 + H_2$ at 550° C after their etching step.

Figure 11A:
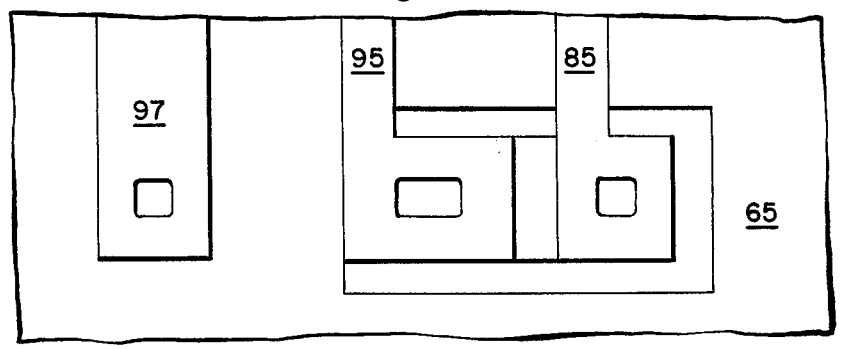
FIGS. 11a and 11b illustrate the completed device following steps during which contacts have been made to the emitter of the horizontal transistor portion of the device and to the base of the vertical transistor portion of the device.
Figure 11B:
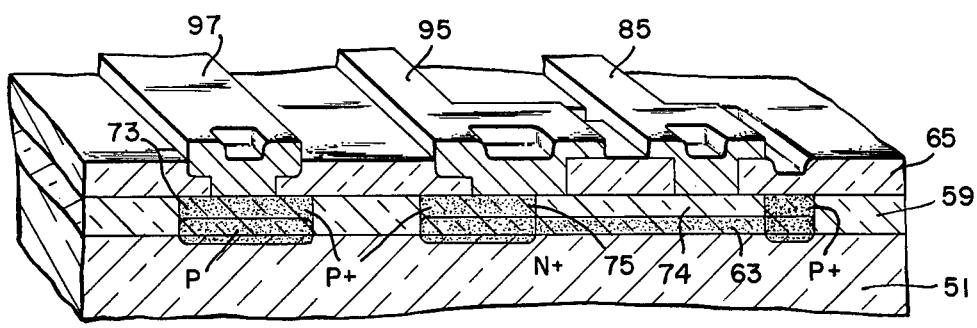

As shown in FIG. 11b, an additional contact 97, extending through the opening 79 into contact with the conductive region 73 to serve as the terminal for the lateral transistor 87 emitter region, is formed from the same metal layer from which the contact 95 is etched. Whereas it is important that the contacts 85 and 95 be formed of different metals, since both contacts are used to create Schottky diodes, it is immaterial whether or not the contact 97 is like one or the other of the contacts 85 and 95. Thus, if desired, it could also be etched from the first deposited metal layer which was used to form contact 85.

It will be appreciated from the foregoing that the present invention is directed principally at improving the characteristics of the vertical transistor portion of an I²L gate circuit. Thus, while the inventive process and the device created thereby have been described in terms of an I²L circuit in which the lateral transistor is disposed adjacent to the vertical transistor, it will be appreciated that the invention could equally well be employed in an I²L circuit wherein the transistor associated with the vertical transistor is not of the lateral configuration as shown herein but is otherwise disposed.

Another point to observe is that the purpose of giving the conductive region 75 an annular configuration is to form, in combination with the buried region 63, a bucket-shaped region which will serve to isolate the portion 74 of the epitaxial layer 59 overlying the buried region 63 from the remainder of the epitaxial layer. The isolated portion 74, it will be recalled, serves as the collector region of the vertical transistor of the I²L circuit. Other techniques for isolating the overlying epitaxial layer region 75 may be employed, however, without departing from the underlying concept of the present invention. One such alternative technique is illustrated in FIGS. 12a and 12b.

Figure 12B:
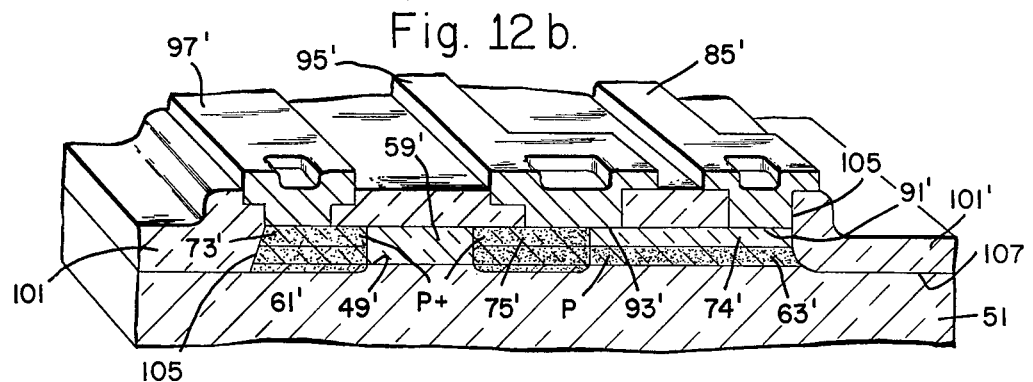
FIGS. 12a and 12b illustrate an alternative method for fabricating the vertical transistor portion of an I²L logic gate in accordance with the principal feature of the invention.
Figure 12A:
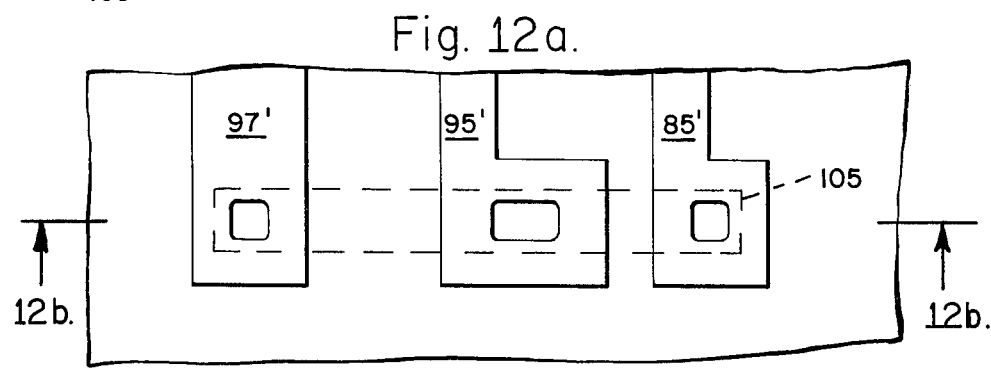

Most of the regions shown in FIGS. 12a and 12b correspond to similar regions illustrated in FIGS. 5–9, with the corresponding parts in FIGS. 12a and 12b being identified by the same reference numerals as those in FIGS. 5–9, but with an added apostrophe ('). The buried regions 61' and 63' are formed in an epitaxial layer 59' by auto-diffusion in the same manner previously described with reference to FIGS. 5 and 6. The epitaxial layer 59' is then masked and etched down to the level 107 of the substrate 51' to create a strip-shaped mesa defined by the dashed line 105 in FIG. 12b. The oxide layer 101 is next grown to isolate the devices which are to be formed in the mesa. The conductive regions 73' and 75' are formed in essentially the same manner as their similarly numbered counterparts were described with reference to FIGS. 7 and 8. Because of the oxide isolation, however, the regions 75' need not be annular. Instead it may simply extend a short distance along the epitaxial mesa 105, thereby separating the region 74' from the remaining portions of the epitaxial layer 59'.

Thus, complete isolation of the epitaxial layer region 74' is accomplished by surrounding it with the oxide layer 101 on three sides and by the doped conductive region 75' on the fourth side.

Contacts 85', 95' and 97' may be formed by the same process as described with reference to FIGS. 9–11, to form the isolating and clamping Schottky diodes 91' and 93'.

Figure 13A:
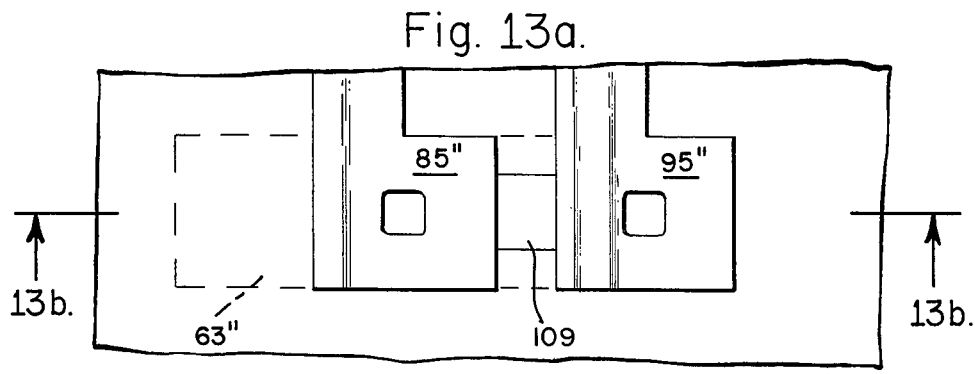
FIGS. 13a and 13b represent a second alternative technique for producing the vertical transistor portion of an I²L gate structure in accordance with the present invention.
Figure 13B:
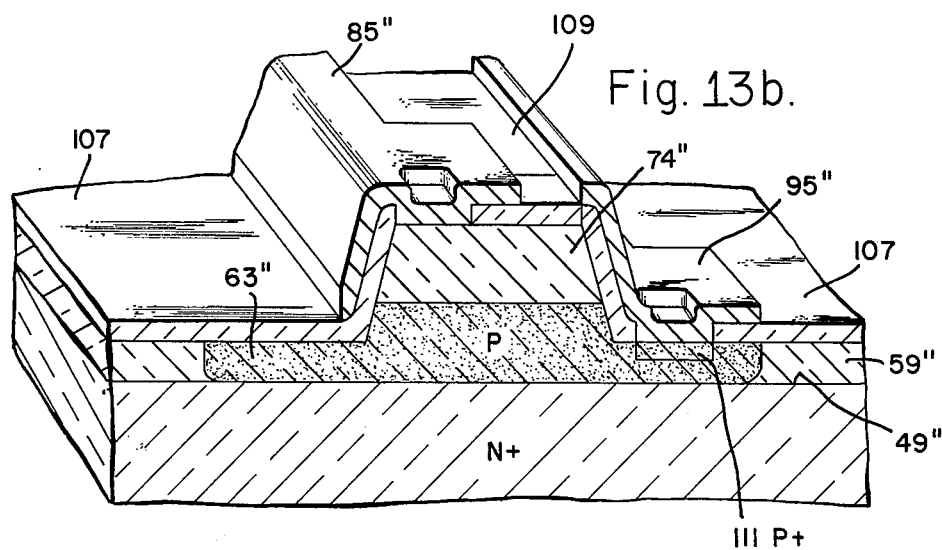

In the case of the I²L gate structure illustrated in FIGS. 11a, 11b and FIGS. 12a, 12b, contact to the buried regions 63 and 63', respectively, is shown to be established by means of a P+ diffusion. That this need not necessarily be so is illustrated by a further possible modification of the device illustrated in FIGS. 13a and 13b. Elements of the circuit which correspond to those illustrated in FIGS. 11a and 11b are identified by the same reference numerals but with a double apostrophe (") added. Essentially, the device of FIGS. 13a and 13b is comprised of a semiconductor substrate 51" having an epitaxial layer 59" thereon into which there has been auto-diffused a P region 63" covered by a layer 74" of the original epitaxial layer. Direct contact to the base region 63', is through metal layer 95".

The device may be constructed by doping the N+ wafer 51" with a P-type dopant in the manner explained with reference to FIGS. 5a and 5b. An epitaxial layer 59" is then grown, causing the P dopant to auto-diffuse into the epitaxial layer, creating the region 63" in the manner previously explained with reference to FIGS. 7a and 7b. Finally a layer of thin oxide and a layer of thin nitride are grown on top of the epitaxial layer. The device is again masked and selectively etched to remove the epitaxial layer 59" and parts of the auto-doped P region 63", resulting in the mesa configuration seen in FIG. 13b. Next a thick oxide layer 107 is grown over the surface of the epitaxial layer 59" exposed by the previous etching step. It will be noted that, because of the layer of thin oxide and thin nitride on top of the mesa created by the etching step, there will be no growth of thick oxide on top of that mesa. As an optional step a P diffusion 111 may be created if it is not desired to make the contact 95" a Schottky diode. The next step is to make contact openings in the thin oxide 109 and in the thick oxide 107 after which the metal contacts 85" and 95" may be formed.

The I²L structures illustrated in FIGS. 12a and 12b, and in FIGS. 13a and 13b share all of the advantages which were ascribed to the structure illustrated in FIGS. 11a and 11b. One of these advantages which was stated but not explained with reference to the structures of FIGS. 11a and 11b was that the width of the base of the vertical transistor 89, constituted of the buried region 63, is independent of the thickness of the epitaxial layer 59. This is so because the width of the base is determined precisely by, and is only a function of, the depth of penetration of the dopant during the auto-doping step from the region 47 into the epitaxial layer 59. Any variations which might occur in the total thickness of the epitaxial layer 59 will affect only the thickness of the epitaxial layer portion 74 which overlies the buried region 63 and will therefore result only in variations in the resistance of the collector region of the vertical transistor 89.

The advantages claimed hereinabove for the I²L gate circuit fabricated in accordance with the present invention have been confirmed experimentally. In a typical I²L structure constructed in accordance with the invention the β (beta) of the vertical NPN transistor was observed to be 180 in comparision with a β of 12 for the corresponding transistor fabricated by standard techniques. Also observed was an increase in the collector breakdown voltage. Moreover in I²L structures fabricated by auto-diffusion in accordance with the present invention and incorporating the isolating Schottky diodes, gate delays were found reduced by a factor of almost 3 and power dissipation per gate was also reduced. Further improvements in speed and power was realized in transistors incorporating a clamping Schottky diode as well as the isolating Schottky diodes. In the latter type of structure gate delays as low as 2.5 nanoseconds were achieved.

In summary, I²L characteristics have been improved by the present invention through two innovations: (1) doping profile optimization of the vertical NPN transistor by auto-doping into an epitaxial layer and (2) by the addition of Schottky diodes as part of the improved circuit. Improvements brought about by doping profile optimization include higher NPN transistor betas, higher NPN transistor breakdown voltages, reduced power consumption and reduced gate delay, as well as permitting the advantageous fabrication of Schottky diodes as part of the steps used to make the auto-diffused I²L device. Incorporation of the latter devices were seen to contribute further to the improvement of the I²L gate characteristics by reducing both power consumption and minimum gate delay as well as permitting isolation of multiple outputs.

What is claimed is:

1. A method of fabricating an integrated circuit comprising the steps of
   (a) driving, into first and second spaced-apart regions in the surface of a first conductivity type semiconductor body, a second conductivity type dopant;
   (b) growing a first conductivity type epitaxial layer on said surface and auto-doping dopant from said spaced-apart regions in said semiconductor body to form corresponding first and second spaced-apart buried, second conductivity type regions in said epitaxial layer;
   (c) driving a second conductivity type dopant into the surface of said epitaxial layer to form first and second conductive regions extending from said last recited surface to said first and second buried regions, said second conductive region having an annular configuration and, together with said second buried region, forming a bucket-shaped region in said epitaxial layer; and
   (d) depositing electrical contacts on said epitaxial layer over said first and second conductive regions and over that portion of said epitaxial layer which is within said annular region.

2. The method of claim 1 characterized further in that said epitaxial layer growing step is controlled to produce a layer whose doping concentration is lower than that of said semiconductor body.

3. The method of claim 2 characterized further in that the step of driving dopant into the surface of said semiconductor body and the step of growing said epitaxial layer are controlled so that the doping concentration of the buried regions resulting therefrom is greater than that of the epitaxial layer but less than that of said semiconductor body.

* * * * *